(12) United States Patent
Stanton et al.

(10) Patent No.: US 9,252,788 B1
(45) Date of Patent: Feb. 2, 2016

(54) PHASE ERROR DETECTION IN PHASE LOCK LOOP AND DELAY LOCK LOOP DEVICES

(71) Applicant: INTERNATIONAL BUSINESS MACHINES CORPORATION, Armonk, NY (US)

(72) Inventors: John W. Stanton, Boxborough, MA (US); Pradeep Thiagarajan, Chapel Hill, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/483,565

(22) Filed: Sep. 11, 2014

(51) Int. Cl.
*G01R 25/00* (2006.01)
*H03L 7/095* (2006.01)

(52) U.S. Cl.
CPC ........................................ *H03L 7/095* (2013.01)

(58) Field of Classification Search
None
See application file for complete search history.

(56) References Cited

U.S. PATENT DOCUMENTS

| | | | |
|---|---|---|---|
| 3,893,042 A | 7/1975 | Whitman et al. |
| 4,087,628 A | 5/1978 | Sanders et al. |
| 4,437,072 A | 3/1984 | Asami |
| 4,724,402 A | 2/1988 | Ireland |
| 4,870,382 A | 9/1989 | Keate et al. |
| 4,870,660 A | 9/1989 | Keate |
| 4,884,035 A | 11/1989 | Cok et al. |
| 5,008,635 A | 4/1991 | Hanke et al. |
| 5,099,213 A | 3/1992 | Yamakawa et al. |
| 5,256,989 A | 10/1993 | Parker et al. |
| 5,278,520 A | 1/1994 | Parker et al. |
| 5,294,894 A | 3/1994 | Gebara |
| 5,315,186 A | 5/1994 | Baker |
| 5,327,103 A | 7/1994 | Baron et al. |
| 5,337,022 A | 8/1994 | Pritchett |
| 5,394,444 A | 2/1995 | Silvey et al. |
| 5,406,590 A | 4/1995 | Miller et al. |
| 5,410,571 A | 4/1995 | Yonekawa et al. |
| 5,491,439 A | 2/1996 | Kelkar et al. |
| 5,525,932 A | 6/1996 | Kelkar et al. |
| 5,530,383 A | 6/1996 | May |
| 5,656,977 A | 8/1997 | Kelkar et al. |

(Continued)

FOREIGN PATENT DOCUMENTS

| | | |
|---|---|---|
| CN | 102497203 | 6/2012 |
| JP | 05259901 | 10/1993 |

(Continued)

OTHER PUBLICATIONS

Spice, "Op Amp Triangle-Wave Generator" eCircuit Center, http://www.ecircuitcenter.com/Circuits/op_tri_gen/op_tri_gen.htm, 2005, 6 Pages.

(Continued)

*Primary Examiner* — Cassandra Cox
(74) *Attorney, Agent, or Firm* — Steven Meyers; Roberts Mlotkowski Safran & Cole, P.C.

(57) ABSTRACT

A device includes a lock detect circuit that is structured and arranged to: convert a reference clock to a reference triangle wave; convert a feedback clock to a feedback triangle wave; determine whether the feedback triangle wave is within a tolerance margin that is defined relative to the reference triangle wave; and generate a determiner output that is a first value when the feedback triangle wave is not within the tolerance margin, and a second value when the feedback triangle wave is within the tolerance margin.

20 Claims, 4 Drawing Sheets

(56) References Cited

U.S. PATENT DOCUMENTS

| | | |
|---|---|---|
| 5,680,076 A | 10/1997 | Kelkar et al. |
| 5,757,857 A | 5/1998 | Buchwald |
| 5,870,002 A | 2/1999 | Ghaderi et al. |
| 5,963,608 A | 10/1999 | Casper et al. |
| 6,112,125 A | 8/2000 | Sandusky |
| 6,115,438 A | 9/2000 | Andresen |
| 6,133,769 A | 10/2000 | Fontana et al. |
| 6,177,842 B1 | 1/2001 | Ahn et al. |
| 6,215,834 B1 | 4/2001 | McCollough |
| 6,404,240 B1 | 6/2002 | Hakkal et al. |
| 6,466,058 B1 | 10/2002 | Goldman |
| 6,496,554 B1 | 12/2002 | Ahn |
| 6,542,041 B2 | 4/2003 | Choi |
| 6,566,920 B1 | 5/2003 | Kim |
| 6,670,834 B1 | 12/2003 | Swanson |
| 6,714,083 B2 | 3/2004 | Ishibashi |
| 6,757,349 B1 | 6/2004 | Katayama et al. |
| 6,760,394 B1 | 7/2004 | Cao et al. |
| 6,762,631 B1 | 7/2004 | Kumar |
| 6,765,444 B2 | 7/2004 | Wang et al. |
| 6,794,944 B2 | 9/2004 | Hirai |
| 6,798,858 B1 | 9/2004 | Atallah et al. |
| 6,825,702 B2 | 11/2004 | Montagnana |
| 6,879,195 B2 | 4/2005 | Green et al. |
| 6,954,510 B2 | 10/2005 | Lee |
| 7,015,727 B2 | 3/2006 | Balasubramanian |
| 7,116,145 B2 | 10/2006 | Kim et al. |
| 7,183,818 B2 | 2/2007 | Tsuji |
| 7,183,861 B2 | 2/2007 | Jung |
| 7,227,386 B2 | 6/2007 | Chen |
| 7,268,629 B2 | 9/2007 | Takase |
| 7,323,946 B2 | 1/2008 | Seefeldt et al. |
| 7,397,881 B2 | 7/2008 | Yamazaki |
| 7,480,361 B1 | 1/2009 | Zhang et al. |
| 7,620,126 B2 | 11/2009 | Boerstler et al. |
| 7,715,725 B2 | 5/2010 | Takasaka et al. |
| 7,777,540 B2 | 8/2010 | Peng et al. |
| 8,040,156 B2 | 10/2011 | Lee et al. |
| 8,059,774 B2 | 11/2011 | Kong et al. |
| 8,076,979 B2 | 12/2011 | Kathuria et al. |
| 2007/0090887 A1* | 4/2007 | Seefeldt et al. ............... 331/17 |
| 2010/0127742 A1 | 5/2010 | Chen |
| 2013/0050013 A1 | 2/2013 | Kobayashi et al. |

FOREIGN PATENT DOCUMENTS

| | | |
|---|---|---|
| JP | 09307436 | 11/1997 |
| JP | 10322200 | 12/1998 |

OTHER PUBLICATIONS

Store, "The Integrator Amplifier", http://www.electronics-tutorials.ws/opamp/opamp_6.html, Sep. 9, 2014; 7 Pages.

* cited by examiner

PHASE ERROR DETECTION IN PHASE LOCK LOOP AND DELAY LOCK LOOP DEVICES

FIELD OF THE INVENTION

The invention relates to phase error detection and, more particularly, to phase error detection in phase lock loop and delay lock loop devices.

BACKGROUND

Phase error (phase offset) is the time difference between relevant edges of the reference input clock and the feedback input to the phase detector of a phase lock loop (PLL). There are two type of phase error: static phase error and dynamic phase error. Static phase error is the time difference between the averaged input reference clock and the averaged feedback input signal when the PLL is in locked mode. Static phase error excludes jitter components. Dynamic phase error is the phase difference between the input clock and output clock due to inability of the PLL to instantaneously update the output clock when the period of the input clock changes. Dynamic phase error is also referred to as tracking skew, and includes jitter.

Phase jitter is the deviation in static phase offset for a controlled edge with respect to a mean value of static phase offset. Static phase error is caused by non-ideal elements in the PLL, such as the charge pump, phase detector, dividers in path, etc. Dynamic phase error is caused by reference clock jitter, VCO jitter, supply noise variations, etc. While zero phase error is ideal, the realistic offset for any PLL system is a measure of the ability of the loop to align the phases of the reference clock to the feedback clock. The wider this offset, the wider the phase relationship of a PLL output clock to the reference clock. The magnitude of the variation of phase offset is thus defined as phase jitter.

A lock detect circuit may be used to determine the lock state of a PLL. Information regarding the lock state of a PLL is used in a variety of applications, such as a macro test pass/fail criteria for manufacturing screen of wafers and modules in test. The lock signal may also be used as an indicator to a higher level system that stable clocking has been achieved and hence subsequent operations may be performed. During power-up or event changes (such as reference clock frequency change/divider value change/output frequency change) the PLL must achieve a lock state before the PLL clock signals or derivatives are suitable for use in downstream processing. Downstream circuits may go on standby mode for a preprogrammed wait time while the PLL is achieving lock.

Lock detect circuits are typically implemented as pure digital circuits that use digital counters. The counters generate pulses on different count codes and ensure that those pulses do not overlap. However, no pulses are generated at times when no feedback clock is present, which may cause the lock indicator to falsely report a lock condition.

SUMMARY

In a first aspect of the invention, there is a device including a lock detect circuit that is structured and arranged to: convert a reference clock to a reference triangle wave; convert a feedback clock to a feedback triangle wave; determine whether the feedback triangle wave is within a tolerance margin that is defined relative to the reference triangle wave; and generate a determiner output that is a first value when the feedback triangle wave is not within the tolerance margin and a second value when the feedback triangle wave is within the tolerance margin.

In another aspect of the invention, there is a lock detect circuit including: a first ramp generator that converts a reference clock to a reference triangle wave; and a second ramp generator that converts a feedback clock to a feedback triangle wave. The lock detect circuit also includes a first margin setter that generates: a first margin signal that defines an upper bound of a tolerance margin relative to the reference triangle wave, and a second margin signal that defines a lower bound of the tolerance margin relative to the reference triangle wave. The lock detect circuit further includes: a second margin setter that generates a comparison triangle wave based on the feedback triangle wave; a determiner circuit that continuously compares the comparison triangle wave to the first margin signal and the second margin signal and that generates a determiner output based on the comparing; and a lock signal generation unit that generates a lock detect signal based on the determiner output.

In another aspect of the invention, there is a method of lock detection including: converting a reference clock to a reference triangle wave; converting a feedback clock to a feedback triangle wave; generating a first margin signal that defines an upper bound of a tolerance margin relative to the reference triangle wave; generating a second margin signal that defines a lower bound of the tolerance margin relative to the reference triangle wave; generating a comparison triangle wave based on the feedback triangle wave; continuously comparing the comparison triangle wave to the first margin signal and the second margin signal; generating a determiner output based on the comparing; and generating a lock detect signal based on the determiner output.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to phase error detection and phase-frequency lock indication and, more particularly, to phase error detection and phase-frequency lock indication in phase lock loop and delay lock loop devices. According to aspects of the invention, analog circuitry is used to compare the phase of a feedback clock and a reference clock using triangular profiles of the clocks. In embodiments, an analog lock detect circuit is configured to: convert square/sinusoidal waves of a reference clock and a feedback clock to respective triangle waves; create a first margin signal and a second margin signal around the reference clock triangle wave; determine in real time whether the feedback clock triangle wave is between the first margin signal and the second margin signal; and generate a lock signal indicating a system lock when the feedback clock triangle wave remains between the high margin signal and the low margin signal for a predetermined amount of time. In this manner, aspects of the invention provide an analog implementation of a phase error detector that is suited for use with phase lock loop and delay lock loop devices.

As described herein, implementations of a lock detect circuit in accordance with aspects of the invention include both frequency and phase match indications, as opposed to separate frequency only lock indicators and phase only lock indicators. Implementations of the invention advantageously provide a high accuracy for defined margin. Implementations of the invention also advantageously avoid false lock indications that may occur in digital lock detect circuits. This is due to the analog lock detect circuit of the present invention utilizing the feedback clock, and only indicating a lock state when a triangle wave generated by the feedback clock falls within a tolerance margin defined by an upward offset and a downward offset applied to a triangle wave generated by the reference clock. Implementations of the invention also advantageously provide tunable tolerance settings in that the tolerance margin defined by upward offset and a downward offset can be programmed/changed.

Figure 1:
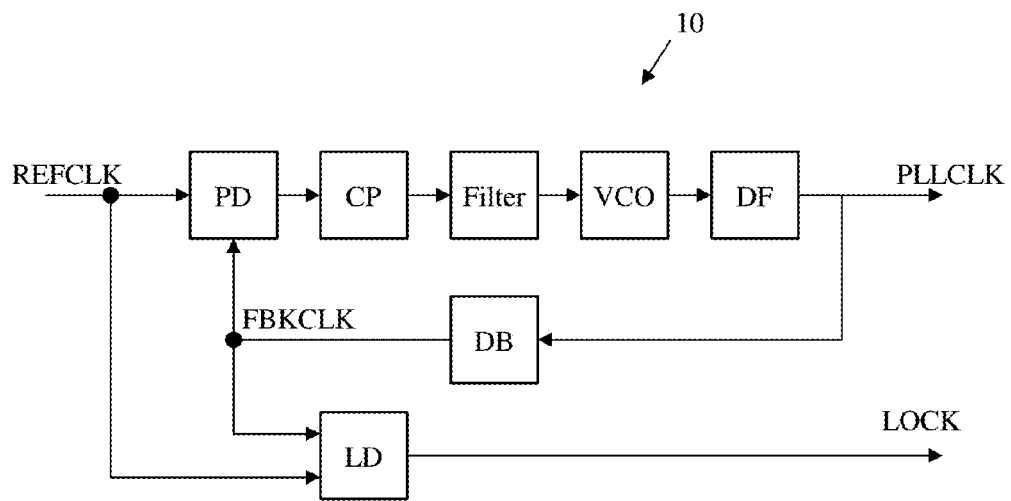
FIG. 1 shows a phase lock loop.

FIG. 1 shows an exemplary phase lock loop (PLL) 10. The PLL 10 is a control circuit that generates an output signal "PLLCLK" whose phase is related to the phase of an input signal "REFCLK". The PLL 10 shown in FIG. 1 includes: a phase frequency detector "PD"; a charge pump "CP"; a filter "Filter"; a voltage control oscillator "VCO"; a forward divider "DF"; a feedback divider "DB"; and a lock detector "LD". The lock detector LD (also called a lock indicator or a lock detect circuit) is a circuit used to identify frequency and/or phase lock in the PLL 10. The lock detector LD receives REFCLK and a feedback clock "FBKCLK" as inputs, and outputs a lock signal "LOCK" as a high or low value (e.g., 1 or 0) that indicates whether the PLL 10 has achieved frequency and/or phase lock.

Figure 2:
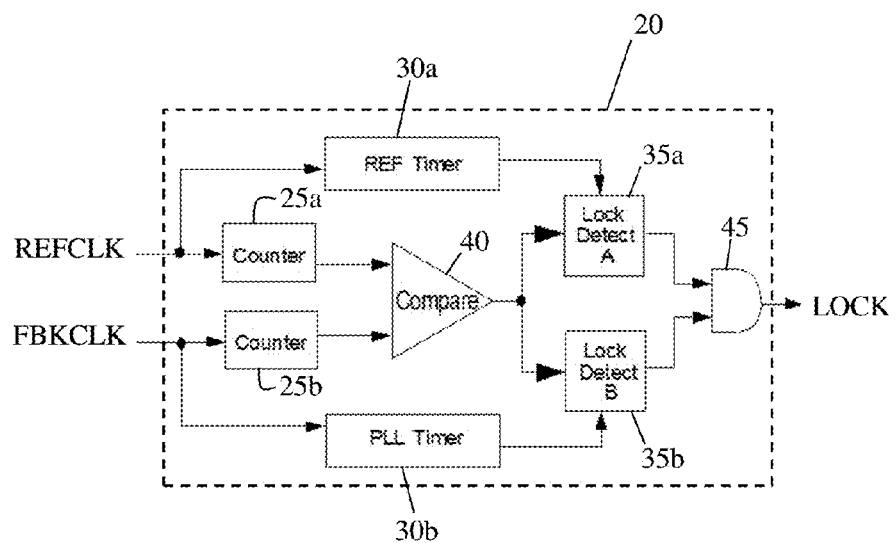
FIG. 2 shows a digital lock detect circuit.

FIG. 2 shows an exemplary digital lock detect circuit 20 that may be used as the lock detector LD of FIG. 1. The lock detect circuit 20 includes: counters 25a, 25b that receive REFCLK and FBKCLK; timers 30a, 30b; lock detectors 35a, 35b; a compare circuit 40, and an AND gate 45 that outputs LOCK. When LOCK is high, this indicates the PLL is frequency locked to the selected reference clock. To determine this locked condition, the reference clock and the feedback clock are input into respective counters, for example a 3-bit counters. The 3-bit counters are initialized at different values with a separation of say, two. When the 3-bit counters do not equal each other within a specified timeout period, LOCK is asserted high to indicate lock. For each time domain (the reference clock and the feedback clock), the timeout period is implemented with an longer counter, for example a 11-bit counter running off its respective clock. The accuracy or resolution of this calculation is determined by the 3-bit counters separation divided by the timeout period. If either the reference clock or the feedback clock stops running but not both, LOCK is forced low which indicates a problem.

Low precision digital lock indicators do not take precision of frequency and phase settling into account, and these circuits usually place several disclaimers on the usage of the lock signal. Highly precise digital lock indicators, on the other hand, have a tight window within which frequency and/or phase deviations are permitted to occur. The definition of the acceptable margin is one of the specifications of the lock detection circuit and the overall PLL architecture. The margin takes into account the allowable VCO jitter, reference clock jitter, and supply noise variation tolerable by the PLL application. The downstream application may be able to tolerate a certain percentage of frequency or phase deviation; however, when the lock indicator has a tighter margin it can hinder the system by indicating a loss of phase/frequency lock even though the system is capable of handling the offset.

Figures 3A, 3B:
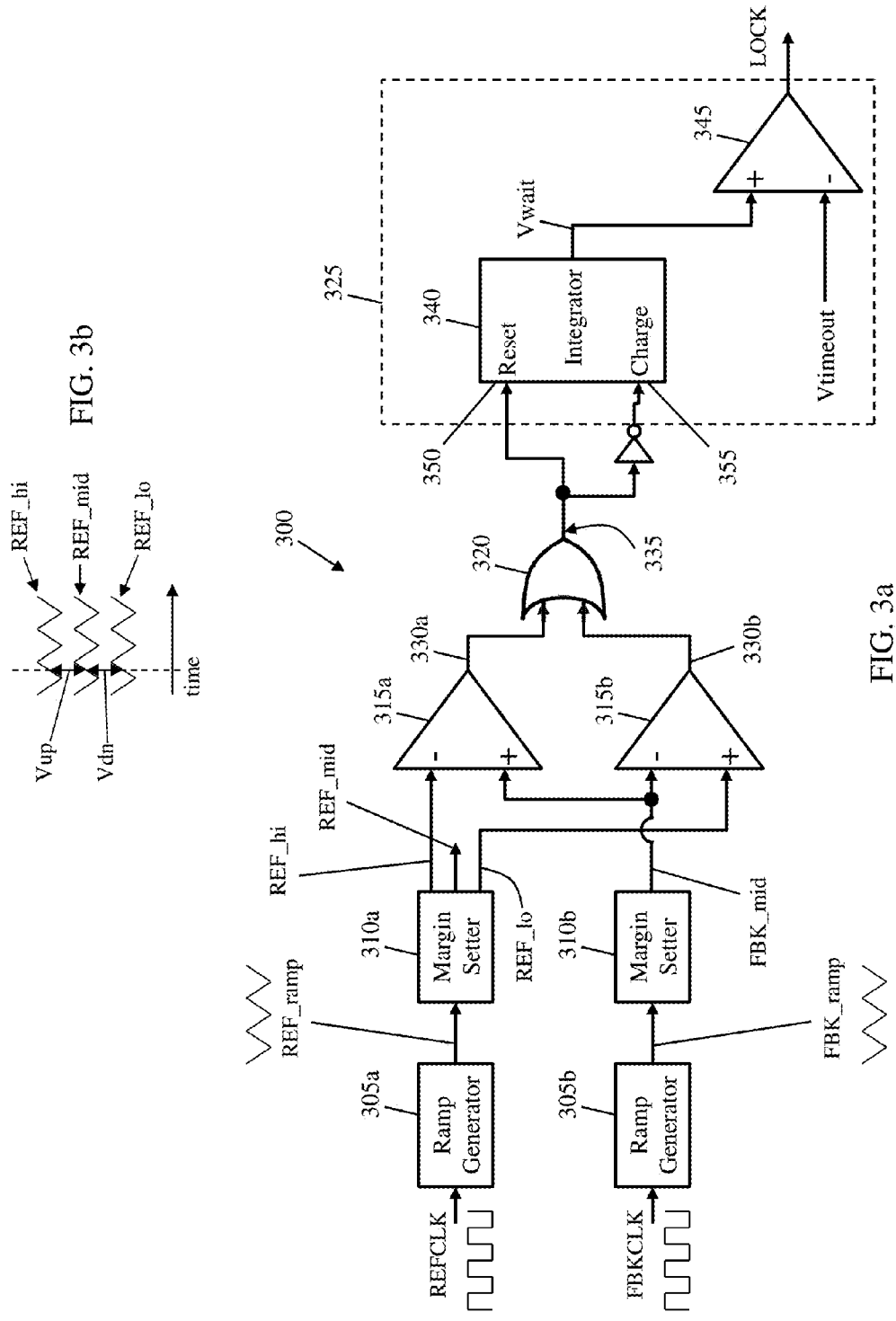
FIG. 3a shows an analog lock detect circuit in accordance with aspects of the invention.
FIG. 3b shows output signals of a margin setter of the lock detect circuit in accordance with aspects of the invention.

FIG. 3a shows an exemplary analog lock detect circuit 300 that may be used as the lock detector in a PLL or a delay lock loop (DLL) in accordance with aspects of the invention. For example, the lock detect circuit 300 may be used as the lock detector LD of FIG. 1. According to aspects of the invention, the lock detect circuit 300 is structured and arranged such that the time period information of the reference clock and the feedback clock are translated into the voltage domain. In embodiments, the translation is achieved by converting the square or sinusoidal wave clocks (i.e., the reference clock and the feedback clock) into triangle waves while maintaining the frequency and phase relationships of the original reference and feedback clocks. Each triangle wave has a rising slope for one period of the clock and a similar falling slope for the next adjacent cycle of that clock.

Implementations of the lock detect circuit 300 advantageously utilize a triangle wave profile because a DC-shifted copy of a triangle wave has a constant voltage difference from the original triangle wave at any given time. In embodiments, DC-shifting the reference clock based triangle wave is used to set the margin of tolerance for the frequency and phase mismatch. While other kinds of waves (such a saw-tooth or square wave) can also be DC-shifted, the waveforms have sharp high slew transitions in one or both edges and thus create discontinuities in the acceptable margin profile. Accordingly, the triangle wave profile is preferred to provide a consistent margin profile that has smooth transitions. However, the invention is not limited to use with a triangle wave, and any suitable wave that accomplishes the functions described herein may be used in implementations of the invention.

With continued reference to FIG. 3a, the lock detect circuit 300 includes: ramp generators 305a, 305b; margin setters 310a, 310b; comparators 315a, 315b; OR gate 320; and a lock signal generation unit 325. According to aspects of the invention, the ramp generators 305a, 305b comprise analog circuitry that converts the square/sinusoidal wave signals REFCLK and FBKCLK to triangle wave signals REF_ramp and FBK_ramp. Specifically, each of the ramp generators 305a, 305b creates a linearly rising ramp for the entire period of its respective input clock, and a linearly falling ramp of same rate for the next adjacent cycle of its respective input clock. In embodiments, the ramp generator 305a is identical to the ramp generator 305b for the purpose of providing the same triangle wave conversion to each of REFCLK and FBKCLK since any difference in the respective conversions may introduce error into the system. Exemplary circuitry for each of the ramp generators 305a, 305b is described herein with respect to FIGS. 4 and 5, although other suitable ramp generation circuitry may be used.

In embodiments, the margin setter 310a shown in FIG. 3a comprises analog circuitry that receives the triangle wave signal REF_ramp as an input and generates REF_hi, REF_mid, and REF_lo signals as outputs. REF_mid is a triangle wave that is equivalent in magnitude and period to REF_ramp and including any delay (e.g., time shift) of the margin setter 310a.

As shown in FIG. 3b, REF_hi tracks REF_mid and is DC-shifted higher than REF_mid by a voltage offset amount Vup. Accordingly, REF_hi is a triangle wave that has the same frequency and same phase as REF_mid, and whose value at any given time equals the value of REF_mid at the same voltage shifted upward by the offset amount Vup. As shown in FIG. 3b, REF_lo tracks REF_mid is DC-shifted lower than REF_mid by a voltage offset amount Vdn. Accordingly, REF_lo is a triangle wave that has the same frequency and same phase as REF_mid, and whose value at any given time equals the value of REF_mid at the same voltage shifted downward by the offset amount Vdn. The offset amounts Vup, Vdn of the DC-shift values are predetermined and may be based on the design specification as described in greater detail herein with respect to FIG. 6. According to aspects of the invention, REF_hi and REF_lo define respective upper and lower bounds of a tolerance margin for comparing FBK_mid to REF_mid, and thus for comparing FBK_ramp to REF_ramp.

In embodiments, the margin setter 310b shown in FIG. 3a comprises analog circuitry that receives triangle wave signal FBK_ramp as an input and generates signal FBK_mid as an output. FBK_mid is a triangle wave that is equivalent in magnitude and period to FBK_ramp and including any delay (e.g., time shift) of the margin setter 310b. According to aspects of the invention, the margin setter 310b uses identical circuitry as margin setter 310a, such that the delay (e.g., time shift) of FBK_mid relative to FBK_ramp is the same as the delay (e.g., time shift) of REF_mid relative to REF_ramp. In this manner, the margin setter 310b generates a comparison triangle wave (FBK_mid) based on a feedback triangle wave (FBK_ramp), wherein the comparison triangle wave (FBK_mid) may be a time-shifted copy of the feedback triangle wave (FBK_ramp).

Still referring to FIG. 3a, the comparators 315a, 315b and the OR gate 320 collectively determine whether FBK_mid is between REF_hi and REF_lo, which indicates whether FBK_ramp is deemed equal to REF_ramp within the defined tolerance. In accordance with aspects of the invention, FBK_mid has a value between REF_hi and REF_lo when REFCLK and FBKCLK are locked in frequency and phase within the predetermined tolerance defined in the specification. Accordingly, the comparators 315a, 315b and the OR gate 320 are structured an arranged to output a signal having a first value when FBK_mid is between REF_hi and REF_lo, and a second value when FBK_mid is outside of the band defined by REF_hi and REF_lo.

In embodiments, the comparators 315a, 315b each comprise analog circuitry that performs the comparisons in real time. Specifically, REF_hi and FBK_mid are provided as inputs to the comparator 315a. The output 330a of the comparator 315a is a value of 1 when FBK_mid is greater than REF_hi and a value of 0 at all other times. Thus, the comparator 315a is used to determine whether FBK_mid is greater than REF_hi. Additionally, REF_lo and FBK_mid are provided as inputs to the comparator 315b. The output 330b of the comparator 315b is a value of 1 when FBK_mid is less than REF_lo and a value of 0 at all other times. Thus, the comparator 315b is used to determine whether FBK_mid is less than REF_lo.

The outputs 330a, 330b are provided as inputs to the OR gate 320. In this manner, the output 335 of the OR gate 320 has a value of 0 when FBK_mid is between REF_hi and REF_lo, and a value of 1 when FBK_mid is outside of the band defined between REF_hi and REF_lo. In this manner, the output 335 of the OR gate 320 has a first value (e.g., 0) when REFCLK and FBKCLK are locked in frequency and phase within the predetermined tolerance defined in the specification, and a second value (e.g., 1) when REFCLK and FBKCLK are not locked. In this manner, the comparators 315a, 315b and the OR gate 320 collectively define a determiner circuit that continuously compares a comparison triangle wave (i.e., FBK_mid) to a first margin signal (i.e., REF_hi) and a second margin signal (i.e., REF_lo), wherein the determiner circuit generates a determiner output (i.e., the output 335 of the OR gate 320) based on the comparing.

Still referring to FIG. 3a, the lock signal generation unit 325 is structured and arranged to generate a lock signal "LOCK" indicating a lock state after the output 335 of the OR gate 320 remains at the first value (e.g., 0) for a predetermined amount of time. In embodiments, the lock signal generation unit 325 comprises an analog integrator 340 and an analog comparator 345. The integrator 340 receives the output 335 of the OR gate 320 at a reset input 350, and the inverse of the output 335 of the OR gate 320 at a charge input 355. In this manner, when the output 335 of the OR gate 320 is 1 (e.g., the second value, which indicates no lock), the integrator 340 is in reset mode such that the integrator output "Vwait" is 0. Conversely, when the output 335 of the OR gate 320 is 0 (e.g., the first value, which indicates a lock), the integrator 340 charges such that the integrator output Vwait increases in value from 0 toward the saturation voltage (upper voltage) of the integrator 340.

As shown in FIG. 3a, the integrator output Vwait is provided as a first input to the comparator 345. A predefined voltage "Vtimeout" is provided as the other input of the comparator 345. When Vwait is less than Vtimeout, the output of the comparator 345, i.e., the LOCK signal, has a value of 0 which indicates that system lock is not achieved. When Vwait goes higher than Vtimeout due to continued integration of the integrator 340, the output of the comparator 345 switches to a value of 1 which indicates a system lock, i.e., that REFCLK and FBKCLK have remained locked for greater than a predetermined amount of time. In embodiments, the predetermined amount of time may be set by the designer and is defined by the time constant of the integrator 340 and the value of Vtimeout. This predetermined amount of time corresponds to a wait time during which FBK_mid must remain between REF_hi and REF_lo in order to indicate a system lock (i.e., in order to drive the LOCK signal high).

Still referring to FIG. 3a, the integrator 340 remains in reset mode as long as one of the comparators 315a, 315b fails its test case, i.e., FBK_mid is greater than REF_hi or FBK_mid is less than REF_lo. The integrator 340 is in charge mode when both comparators 315a, 315b pass their test case, i.e., REF_hi>FBK_mid>REF_lo. While the integrator 340 is in charge mode, the value of Vwait increases from 0 toward the saturation voltage (upper voltage) of the integrator 340. When the analog value of Vwait goes higher than Vtimeout, the lock signal LOCK switches to 1 which indicates a system lock condition. After achieving system lock, the circuit maintains LOCK at the high value (e.g., 1) as long as Vwait remains higher than Vtimeout. However, in the event that the system goes out of a lock state (i.e., the frequency and/or phase of FBKCLK changes compared to REFCLK), the value of FBK_mid is no longer within the bound defined by REF_hi and REF_lo, which results in the output 335 of OR gate 320 going high, which instantaneously causes the integrator 340 to reset, which causes the comparator 345 to switch LOCK to a low value (e.g., 0) indicating no system lock. The system may go out of a lock state due to various events such as changes in REFCLK frequency, increase in supply noise, and changes in supply voltage and/or temperature, for example. The loop of the PLL/DLL re-aligns to a frequency and phase match of FBKCLK and REFCLK when the PLL/DLL has had time to respond to the event that forced the out of lock condition, at which point the comparators 315a, 315b indicate passing values, which causes the integrator 340 to increase the value of Vwait until such a time as Vwait equals or exceeds Vtimeout and LOCK is again switched to the high value.

The lock signal generation unit 325 of FIG. 3a is described as a purely analog circuit. However, implementations of the invention may also utilize a digital-based lock signal generation unit that uses a digital counter instead of an analog integrator. This can be accomplished, for example, by starting a digital counter when the output 335 of the OR gate 320 switches to the low value (e.g., 0), which indicates a frequency and phase match of FBKCLK and REFCLK. The digital counter continues to count as long a the output 335 remains high and until a timeout value is reached, at which point the LOCK signal is driven high. If, at any time, the output 335 of the OR gate 320 switches to the high value (e.g., 1) due to a frequency and/or phase mismatch between FBKCLK and REFCLK, then the digital counter resets and the LOCK signal is driven to the low value.

Figure 4:
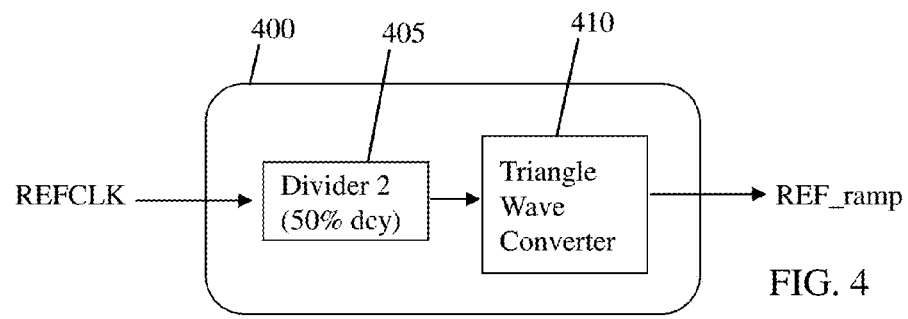
FIG. 4 shows a block diagram of a ramp generator in accordance with aspects of the invention.

FIG. 4 shows a block diagram of an exemplary ramp generator 400 in accordance with aspects of the invention. The ramp generator 400 may be used as the ramp generators 305a and 305b as described with respect to FIG. 3a. In embodiments, the ramp generator 400 includes a divide-by-two circuit 405 with 50% duty cycle output followed by a triangle wave converter 410.

Figure 5:
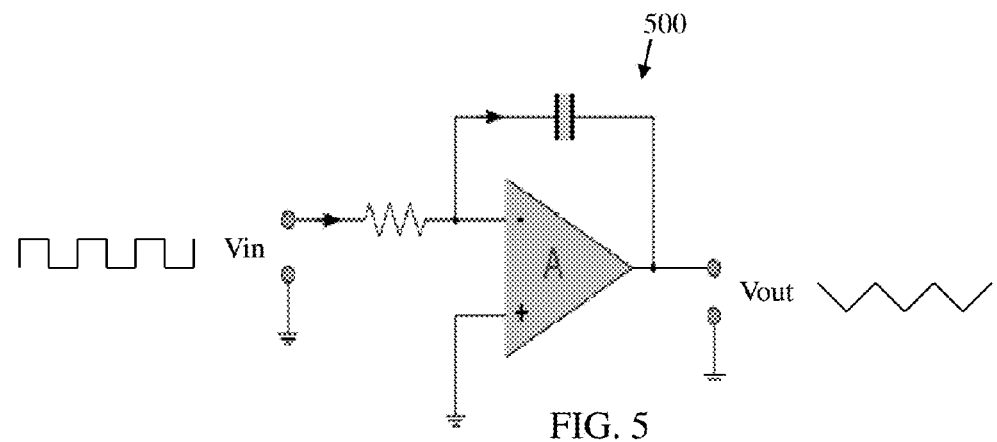
FIG. 5 shows a triangle wave converter usable in aspects of the invention.

FIG. 5 shows an exemplary implementation of a triangle wave converter 500 usable in aspects of the invention. The triangle wave converter 500 may be used in the ramp generators described with respect to FIGS. 3a and 4. The triangle wave converter 500 may include a resistance, a capacitor, and an op-amp "A" connected between Vin and Vout as shown in FIG. 5. In this manner, the triangle wave converter 500 converts the square wave at Vin to a triangle wave at Vout. The invention is not limited to the converter 500 shown in FIG. 5, and other suitable circuits may be used to convert the square/sinusoidal reference clock to a triangle wave.

Figure 6:
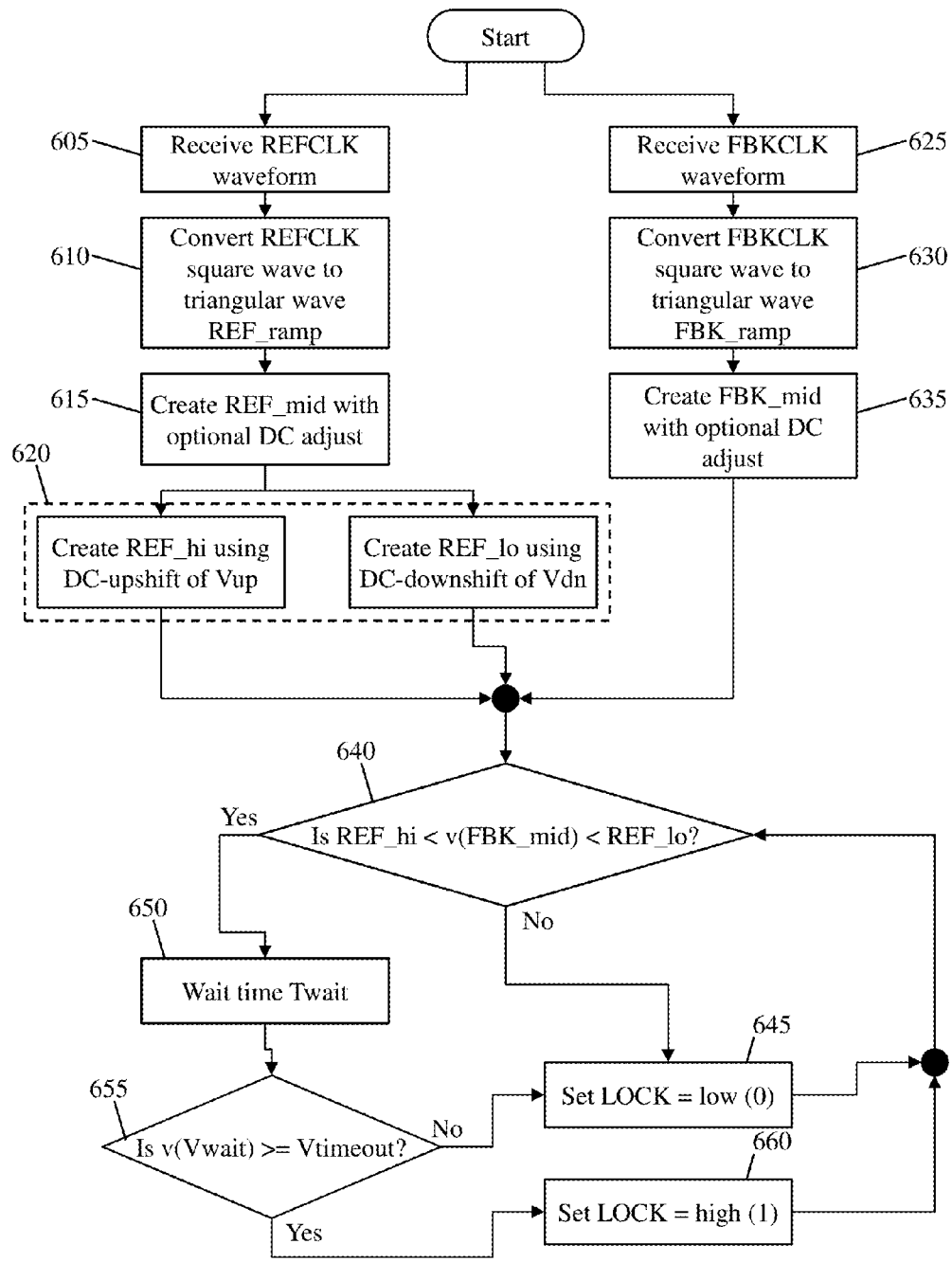
FIG. 6 shows a flow diagram of a method in accordance with aspects of the invention.

FIG. 6 shows a flow diagram of a method of phase error detection in accordance with aspects of the invention. The method may be implemented, for example, using the lock detect circuit 300 described with respect to FIG. 3a. At step 605, the REFCLK waveform is received at the lock detect circuit. The REFCLK waveform may be a reference clock of a PLL or a DLL having a square/sinusoidal wave shape. At step 610, the REFCLK waveform is converted to a triangle waveform REF_ramp. Step 610 may be performed by the ramp generator as described with respect to FIGS. 3a, 4, and 5, e.g., by ramping up and ramping down each adjacent cycle to generate REF_ramp. At step 615, the REF_mid signal is generated based on REF_ramp. Step 615 may be performed by the margin setter 310a as described with respect to FIG. 3a. Step 615 optionally includes applying a DC adjustment to REF_mid for the purpose of matching the operational bounds of a downstream comparator.

At step 620, the REF_hi signal and the REF_lo signal are created based on REF_mid. Step 620 may be performed in the manner described with respect to FIG. 3a, e.g., by applying predetermined DC voltage offsets (e.g., Vup and Vdn) to the REF_mid signal. In embodiments, the values of Vup and Vdn are predetermined based on tolerance definitions that are set forth in the design specification for the PLL or DLL. The tolerance definitions may include a specified allowable phase offset equal to −Tdn to +Tup in seconds. The value of dv/dt is a given for a particular ramp generator and frequency, such that a first upper limit is given as Vup1=dv/dt*Tdn and a first lower limit is given as Vdn1=dv/dt*Tup. The tolerance definitions may also include a specified allowable frequency offset as −Fdn to +Fup in hertz. The frequency of the reference clock is given as F, such that a minimum frequency is given as fmin=F−Fdn and a maximum frequency is given as fmax=F+Fup. The maximum period is then Tmax=1/fmin and the minimum period is then Tmin=1/fmax, such that a second upper limit is given as Vup2=dv/dt*Tmax and a second lower limit is given as Vdn2=dv/dt*Tmin. In embodiments, the offset Vup is selected as the greater of Vup1 and Vup2, and the offset Vdn is selected as the greater of Vdn1 and Vdn2. In this manner, the offsets Vup, Vdn are used to create the tolerance margin for the phase error detection circuit. In another embodiment, if just a phase detect and phase lock indication is required, then the offsets Vup1 and Vdn1 are used for Vup and Vdn respectively. In another embodiment, if just a frequency detect and frequency lock indication is required, then the offsets Vup2 and Vdn2 are used for Vup and Vdn respectively.

Still referring to FIG. 6, at step 625 the FBKCLK waveform is received at the lock detect circuit. The FBKCLK waveform may be a feedback clock of a PLL or a DLL having a square/sinusoidal wave shape. At step 630, the FBKCLK waveform is converted to a triangle waveform FBK_ramp. Step 630 may be performed by the ramp generator as described with respect to FIGS. 3a, 4, and 5, e.g., by ramping up and ramping down each adjacent cycle to generate FBK_ramp. In embodiments, steps 610 and 630 are performed using substantially identical ramp generators, as described with respect to FIG. 3a. At step 635, the FBK_mid signal is generated based on FBK_ramp. Step 635 may be performed by the margin setter 310b as described with respect to FIG. 3a. Step 635 optionally includes applying a DC voltage adjustment to FBK_mid for the purpose of matching the DC level of FBK_mid to that of REF_mid.

At step 640, it is determined whether the instantaneous value of FBK_mid is less than REF_hi and greater than REF_lo, i.e., whether FBK_mid is within the tolerance margin defined by REF_hi and REF_lo. Step 640 may be performed by the comparators 315a, 315b and the OR gate 320 described with respect to FIG. 3a. When FBK_mid is not between REF_hi and REF_lo at step 640, then at step 645 the LOCK signal is driven to the low value (e.g., 0) which indicates that there is not system lock.

When FBK_mid is between REF_hi and REF_lo at step 640, then at step 650 a wait time Twait is waited. At step 655, it is determined whether the value of Vwait is greater than or equal to a value of Vtimeout. In embodiments, Vwait is the output value of the integrator 340 of the lock signal generation unit 325 described with respect to FIG. 3a, and Twait and Vtimeout are defined in the design specification of the PLL or DLL. For example, Twait may be specified as the raw time in seconds or number of cycles of REFCLK, and Vtimeout may be specified such that it is less than or equal to the saturation voltage of the integrator (e.g., integrator 340 of FIG. 3a). In this manner, the dv/dt value of the integrator is calculated as Vtimeout/Twait. When Vwait is less than Vtimeout at step 655, then the LOCK signal is driven to the low value at step 645. On the other hand, when Vwait is greater than or equal to Vtimeout at step 655, then the LOCK signal is drive to the high value at step 660, which indicates a system lock. Steps 645, 650, 655, and 660 may be performed by the lock signal generation unit 325 described with respect to FIG. 3a.

In accordance with an aspect of the invention, a method of lock detection includes converting the time period information of a reference clock (REFCLK) into a voltage value by way of integration (ramp-up) for a cycle and de-integration (ramp-down) for the next cycle. The method includes converting the time period information of a feedback clock (FBKCLK) into a voltage value by way of integration of similar characteristics (ramp-up) for a cycle and de-integration of similar characteristics (ramp-down) for the next cycle. The method includes creating a voltage varying upper limit (REF_hi) and lower limit (REF_lo) of the converted reference clock based on a user defined tolerance margin such that these limits track the converted reference clock in real-time with DC-shifts. The method includes comparing the converted feedback clock continuously to the upper and lower limits to determine whether the converted feedback clock is within the limits. When the converted feedback clock is within the bounds defined by the upper and lower limits, the method further includes waiting a predetermined amount of time to signify frequency and phase match, after which the method repeats. The predetermined amount of time is a wait scheme implemented also by an integration and whose characteristics have a much longer time constant than that associated with the reference clock and the feedback clock. When the converted feedback clock is outside the bounds defined by the upper and lower limits, the method further includes indicating an un-lock state.

In accordance with an aspect of the invention, a circuit for lock detection includes a ramp generator that converts a reference clock (REFCLK) to a triangle wave profile (REF_ramp) such that ramp-up is one time period and ramp-down is the adjacent time period. The circuit includes an identical ramp generator that converts a feedback clock (FBKCLK) to a triangle wave profile (FBK_ramp). The circuit includes a margin setting structure to create upper and lower voltage tolerance levels (REF_hi) and lower limit (REF_lo) that track with REF_ramp. The circuit includes a second optional margin setting structure, identical to the first margin setting structure, to process FBK_ramp for matching delay as well as match the DC level of REF_ramp. The circuit includes a set of comparators to check whether FBK_ramp lies within the upper and lower tolerance levels at any given time, and generate a logic flag when not within the tolerance levels. The circuit includes an integrator with a long time constant that is reset each time the logic flag happens, signifying an unlocked condition. The integrator is otherwise in integration mode increasing its output value toward a predetermined voltage (Vtimeout). The circuit includes a comparator to signify a lock signal when the output voltage of the integrator is more than the predetermined voltage corresponding to a wait time.

The circuits of the present invention can be implemented in semiconductor structures, which can be manufactured in a number of ways using a number of different tools. In general, though, the methodologies and tools are used to form the semiconductor implementations with dimensions in the micrometer and nanometer scale. The methodologies, i.e., technologies, employed to manufacture the semiconductor implementations have been adopted from integrated circuit (IC) technology. For example, the semiconductor implementations are built on wafers and are realized in films of material patterned by photolithographic processes on the top of a wafer. In particular, the fabrication of the semiconductor implementations uses three basic building blocks: (i) deposition of thin films of material on a substrate, (ii) applying a patterned mask on top of the films by photolithographic imaging, and (iii) etching the films selectively to the mask.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A device, comprising:
   a lock detect circuit that is structured and arranged to:
   convert a reference clock to a reference triangle wave;
   convert a feedback clock to a feedback triangle wave;
   determine whether the feedback triangle wave is within a tolerance margin that is defined relative to the reference triangle wave; and
   generate a determiner output that is a first value when the feedback triangle wave is not within the tolerance margin, and a second value when the feedback triangle wave is within the tolerance margin.

2. The device of claim 1, wherein:
   the reference clock is a first square wave or sinusoidal wave clock; and
   the feedback clock is a second square wave or sinusoidal wave clock.

3. The device of claim 2, wherein the reference clock and the feedback clock are part of a phase lock loop (PLL) or a delay lock loop (DLL).

4. The device of claim 1, wherein the lock detect circuit comprises:
   a first ramp generator that performs the converting the reference clock to the reference triangle wave; and
   a second ramp generator that performs the converting the feedback clock to the feedback triangle wave.

5. The device of claim 4, wherein the first ramp generator is identical to the second ramp generator.

6. The device of claim 1, wherein the lock detect circuit comprises:
   a first margin setter that generates: a first signal that defines an upper bound of the tolerance margin, and a second signal that defines a lower bound of the tolerance margin; and
   a second margin setter that, prior to the determining, applies a time shift to the feedback triangle wave equal to a time shift associated with the first margin setter.

7. The device of claim 1, wherein the lock detect circuit comprises a pair of comparators and an OR gate that are structured and arranged to perform the determining whether the feedback triangle wave is within the tolerance margin.

8. The device of claim 1, wherein:
   the lock detect circuit further comprises an analog integrator and a comparator that are structured and arranged to generate a lock detect signal based on the determiner output;

the lock detect signal is a first level when the determiner output is the first value; and the lock detect signal is a second value when the determiner output is the second value for a predetermined amount of time.

9. A lock detect circuit, comprising:
a first ramp generator that converts a reference clock to a reference triangle wave;
a second ramp generator that converts a feedback clock to a feedback triangle wave;
a first margin setter that generates: a first margin signal that defines an upper bound of a tolerance margin relative to the reference triangle wave, and a second margin signal that defines a lower bound of the tolerance margin relative to the reference triangle wave;
a second margin setter that generates a comparison triangle wave based on the feedback triangle wave;
a determiner circuit that continuously compares the comparison triangle wave to the first margin signal and the second margin signal and that generates a determiner output based on the comparing; and
a lock signal generation unit that generates a lock detect signal based on the determiner output.

10. The lock detect circuit of claim 9, wherein:
the determiner output is a first value when the feedback triangle wave is between the first margin signal and the second margin signal; and
the determiner output is a second value when the feedback triangle wave is not between the first margin signal and the second margin signal.

11. The lock detect circuit of claim 9, wherein the lock signal generation unit comprises an analog integrator that receives the determiner output at a reset input and receives an inverse of the determiner output at a charge input.

12. The lock detect circuit of claim 11, wherein the lock signal generation unit comprises a comparator that receives an output voltage of the integrator at a first input and a voltage corresponding to a predetermined wait time at a second input.

13. The lock detect circuit of claim 12, wherein an output of the comparator is the lock detect signal.

14. The lock detect circuit of claim 13, wherein:
the output of the comparator is a first value when the comparison triangle wave is not between the first margin signal and the second margin signal; and
the output of the comparator is a second value when the comparison triangle wave remains between the first margin signal and the second margin signal for a predetermined amount of time.

15. The lock detect circuit of claim 9, wherein:
the first margin signal tracks the reference triangle wave and is offset from the reference triangle wave by a first predetermined amount; and
the second margin signal tracks the reference triangle wave and is offset from the reference triangle wave by a second predetermined amount.

16. The lock detect circuit of claim 15, wherein the first predetermined amount and the second predetermined amount are based on at least one of allowable phase offset and allowable frequency offset as defined in a specification of the lock detect circuit.

17. The lock detect circuit of claim 9, wherein the lock detect circuit is included in a phase lock loop (PLL) or a delay lock loop (DLL).

18. The lock detect circuit of claim 9, wherein:
the first ramp generator is identical to the second ramp generator; and
the first margin setter is identical to the second margin setter.

19. A method of lock detection, comprising:
converting a reference clock to a reference triangle wave;
converting a feedback clock to a feedback triangle wave;
generating a first margin signal that defines an upper bound of a tolerance margin relative to the reference triangle wave;
generating a second margin signal that defines a lower bound of the tolerance margin relative to the reference triangle wave;
generating a comparison triangle wave based on the feedback triangle wave;
continuously comparing the comparison triangle wave to the first margin signal and the second margin signal;
generating a determiner output based on the comparing; and
generating a lock detect signal based on the determiner output.

20. The method of claim 19, wherein the generating the lock detect signal comprises;
setting the lock detect signal to a first value when the comparison triangle wave is not between the first margin signal and the second margin signal; and
setting the lock detect signal to a second value when the comparison triangle wave is remains between the first margin signal and the second margin signal for a predetermined amount of time.

\* \* \* \* \*